United States Patent
Jang et al.

(10) Patent No.: US 12,181,939 B2
(45) Date of Patent: Dec. 31, 2024

(54) ELECTRONIC DEVICE

(71) Applicant: SAMSUNG ELECTRONICS CO., LTD., Suwon-si (KR)

(72) Inventors: Dongoh Jang, Suwon-si (KR); Kwangbok Park, Suwon-si (KR); Gyunghoon Lee, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 148 days.

(21) Appl. No.: 17/971,704

(22) Filed: Oct. 24, 2022

(65) Prior Publication Data

US 2023/0096185 A1 Mar. 30, 2023

Related U.S. Application Data

(63) Continuation of application No. PCT/KR2022/014038, filed on Sep. 20, 2022.

(30) Foreign Application Priority Data

Sep. 30, 2021 (KR) .......................... 10-2021-0130139

(51) Int. Cl.
  *G06F 1/20* (2006.01)
  *G06F 1/16* (2006.01)
  (Continued)

(52) U.S. Cl.
  CPC ............ *G06F 1/203* (2013.01); *G06F 1/1698* (2013.01); *H05K 7/1427* (2013.01); *H05K 7/2039* (2013.01)

(58) Field of Classification Search
  CPC combination set(s) only.
  See application file for complete search history.

(56) References Cited

U.S. PATENT DOCUMENTS 6,763,254 B2 * 7/2004 Nishikawa ............. H04B 15/04
                                                              343/702
8,064,223 B2 * 11/2011 Tachikawa ............. G06F 1/203
                                                              361/810

(Continued)

FOREIGN PATENT DOCUMENTS

JP      2009111698 A    5/2009
JP       3160159 U      6/2010

(Continued)

OTHER PUBLICATIONS

International Search Report with Translation and Written Opinion for International Application No. PCT/KR2022014038; International Filing Date Sep. 20, 2022; Date of Mailing Dec. 27, 2022; 9 Pages.

(Continued)

*Primary Examiner* — Lisa Lea-Edmonds
(74) *Attorney, Agent, or Firm* — CANTOR COLBURN LLP

(57) ABSTRACT

An electronic device according to various embodiments of the disclosure includes a housing including a first surface, a second surface formed parallel to the first surface, and a side surface enclosing a space formed between the first surface and the second surface. The electronic device includes a printed circuit board disposed on the first surface of the housing and an antenna module spaced apart from the side surface of the housing by a predetermined distance and disposed at the first surface of the housing. The electronic device includes also includes a first cable configured to electrically connect the printed circuit board and the antenna module and a heat dissipation unit disposed on one surface of the printed circuit board and having, at one surface thereof, a cable seating path in which at least a portion of the first cable is seated.

20 Claims, 11 Drawing Sheets

(51) Int. Cl.
  *H05K 7/14* (2006.01)
  *H05K 7/20* (2006.01)

(56) References Cited

U.S. PATENT DOCUMENTS

| | | | | |
|---|---|---|---|---|
| 8,687,353 | B2* | 4/2014 | Murakata | G06F 1/1681 |
| | | | | 343/702 |
| 9,917,351 | B2 | 3/2018 | Tai | |
| 11,287,855 | B2 | 3/2022 | Kim et al. | |
| 11,901,966 | B2* | 2/2024 | Park | H04M 1/0277 |
| 12,021,296 | B2* | 6/2024 | Yoo | G06F 1/1681 |
| 2006/0274507 | A1 | 12/2006 | Sura et al. | |
| 2010/0073897 | A1* | 3/2010 | Tachikawa | G06F 1/1616 |
| | | | | 361/752 |
| 2011/0014881 | A1 | 1/2011 | Yang | |
| 2011/0304968 | A1* | 12/2011 | Knopf | G06F 1/182 |
| | | | | 29/854 |
| 2012/0176755 | A1 | 7/2012 | Malek et al. | |
| 2017/0164498 | A1* | 6/2017 | Song | H05K 1/181 |
| 2020/0022281 | A1 | 1/2020 | Diep et al. | |
| 2020/0329549 | A1 | 10/2020 | Seo et al. | |
| 2022/0069437 | A1* | 3/2022 | Yoo | H01Q 1/085 |
| 2022/0344795 | A1* | 10/2022 | Cha | H01Q 1/1207 |
| 2022/0407559 | A1* | 12/2022 | Park | H01Q 1/243 |
| 2023/0021614 | A1* | 1/2023 | Park | H01Q 1/526 |
| 2023/0096185 | A1* | 3/2023 | Jang | G06F 1/1698 |
| | | | | 361/679.54 |
| 2023/0100675 | A1* | 3/2023 | Gu | H05K 1/18 |
| | | | | 361/679.27 |
| 2023/0126247 | A1* | 4/2023 | Yoon | G06F 1/1698 |
| | | | | 361/679.27 |
| 2024/0187038 | A1* | 6/2024 | Park | G06F 1/1698 |

FOREIGN PATENT DOCUMENTS

| | | |
|---|---|---|
| JP | 2017162983 A | 9/2017 |
| JP | 6726958 B2 | 7/2020 |
| KR | 20120026767 A | 3/2012 |
| KR | 20170066990 A | 6/2017 |
| KR | 101765561 B1 | 8/2017 |
| KR | 20200121037 A | 10/2020 |

OTHER PUBLICATIONS

European Search Report Issued In EP Application No. 22876738.0-1218, Mail Date Oct. 10, 2024, 9 Pages.

* cited by examiner

ELECTRONIC DEVICE

CROSS-REFERENCE TO RELATED APPLICATION(S)

This application is a continuation application, claiming priority under § 365(c), of an International Application No. PCT/KR2022/014038, filed on Sep. 20, 2022, which is based on and claims the benefit of a Korean patent application number 10-2021-0130139, filed on Sep. 30, 2021, in the Korean Intellectual Property Office, the disclosure of which is incorporated by reference herein in its entirety.

TECHNICAL FIELD

Various embodiments of the disclosure relate to an electronic device including a heat dissipation unit in which a cable seating structure is formed.

BACKGROUND ART

In a typical notebook personal computer (PC) structure, millimeter wave antenna modules may be disposed at left and right side surfaces of the inside of an electronic device. The millimeter wave antenna module may be connected to a radio frequency (RF) circuit included in a printed circuit board through a coaxial cable. The coaxial cable may be fixed on the printed circuit board using a connection member (e.g., c-clip).

SUMMARY

According to various embodiments of the disclosure, an electronic device includes a housing including a first surface, a second surface formed substantially parallel to the first surface, and a side surface enclosing a space formed between the first surface and the second surface. The electronic device includes a printed circuit board disposed on the first surface of the housing and an antenna module spaced apart from the side surface of the housing by a predetermined distance and disposed on the first surface of the housing. The electronic device also includes a first cable configured to electrically connect the printed circuit board and the antenna module and a heat dissipation unit disposed on one surface of the printed circuit board. The heat dissipation unit has a cable seating path in which at least a portion of the first cable is seated.

According to various embodiments of the disclosure, an electronic device includes a housing including a first surface, a second surface formed substantially parallel to the first surface, and a side surface enclosing a space formed between the first surface and the second surface. The electronic device also includes a printed circuit board disposed on the first surface of the housing and an antenna module spaced apart from the side surface of the housing by a predetermined distance and disposed at the first surface of the housing. The electronic device also includes a first cable configured to electrically connect the printed circuit board and the antenna module and a heat dissipation unit disposed at one surface of the printed circuit board and having a protruding area protruded by a predetermined length at one side thereof. The protruding area has a cable seating area in which at least a portion of the first cable is seated.

An electronic device according to various embodiments of the disclosure can prevent deterioration of a performance thereof due to resonance occurrence by preventing a cable for connecting a millimeter wave antenna module from intersecting with other cables using a heat dissipation unit having a cable seating structure even in the case that a mounting space therein is narrow. The electronic device according to various embodiments of the disclosure may not include a separate clamping component for preventing resonance from occurring and may provide a reinforced fastening structure compared to a cable connection structure using a connection member in the prior art.

BRIEF DESCRIPTION OF DRAWINGS

The above and other advantages and features of this disclosure will become more apparent by describing in further detail embodiments thereof with reference to the accompanying drawings, in which.

MODE FOR DISCLOSURE

Figure 1:
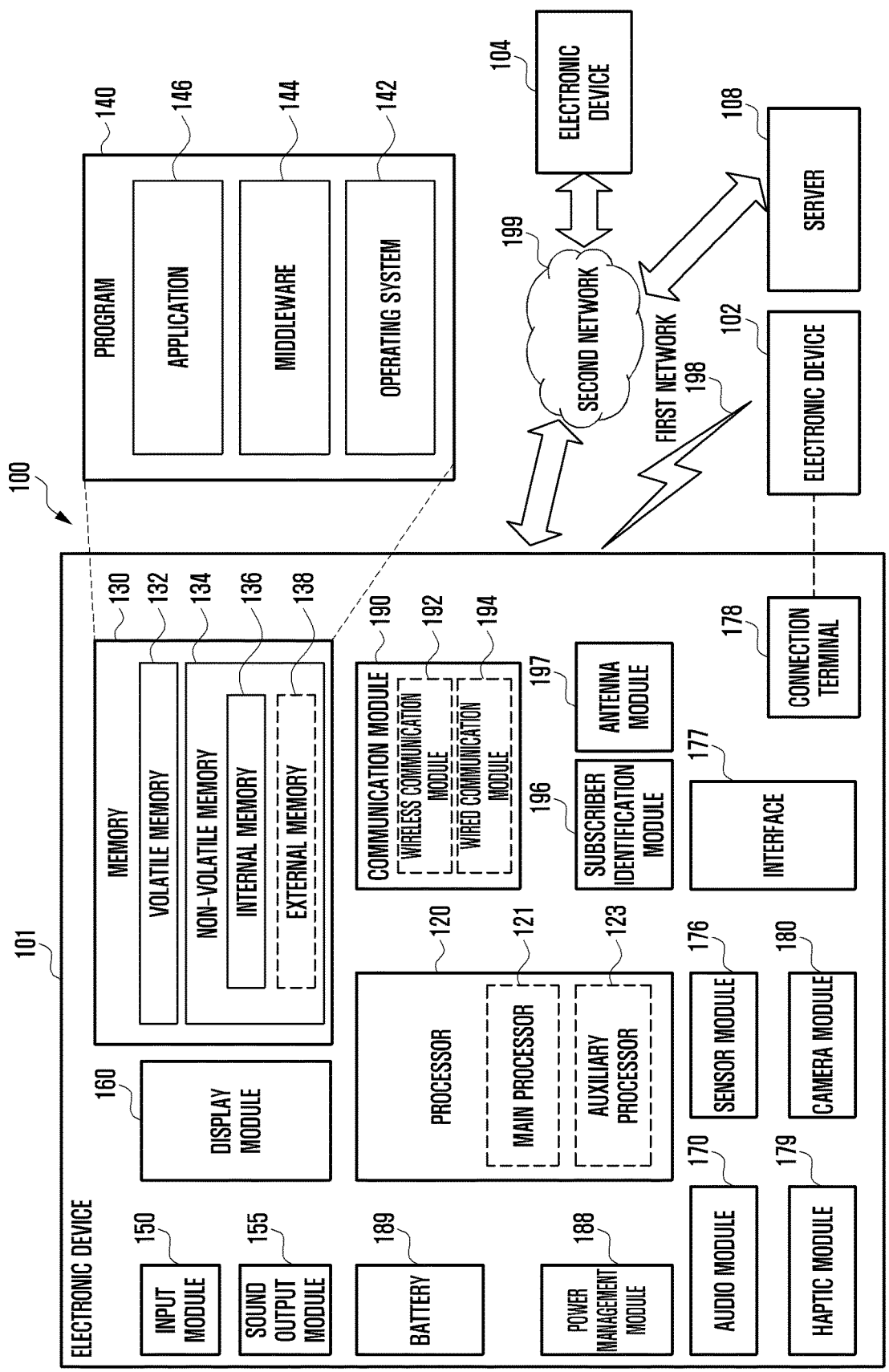
FIG. 1 is a block diagram illustrating an electronic device in a network environment according to various embodiments.

FIG. 1 is a block diagram illustrating an electronic device in a network environment according to various embodiments. Referring to FIG. 1, an electronic device 101 in a network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the millimeter (mm) Wave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

In existing electronic devices, the coaxial cable may overlap or cross other cables for connecting other electrical objects in the electronic device and the printed circuit board. Resonance may occur due to the intersection between the coaxial cable and other cables, and in order to reduce the resonance, a clamping component is additionally required on the printed circuit board. Further, there may be a problem that a connection member for fixing the coaxial cable on the printed circuit board can be incorrectly fastened. An electronic device according to various embodiments of the disclosure may include a heat dissipation unit having a cable seating structure to solve problems of cable crossing and incorrect cable fastening.

In describing the electronic device 101 according to various embodiments of the disclosure, a first direction may mean an x-axis direction. A second direction may mean a y-axis direction, and a third direction may mean a z-axis direction. The first direction (x-axis direction) and the second direction (y-axis direction) are orthogonal to each other. The third direction (z-axis direction) is a direction orthogonal to a plane formed in the first direction (x-axis direction) and the second direction (y-axis direction).

Figure 2:
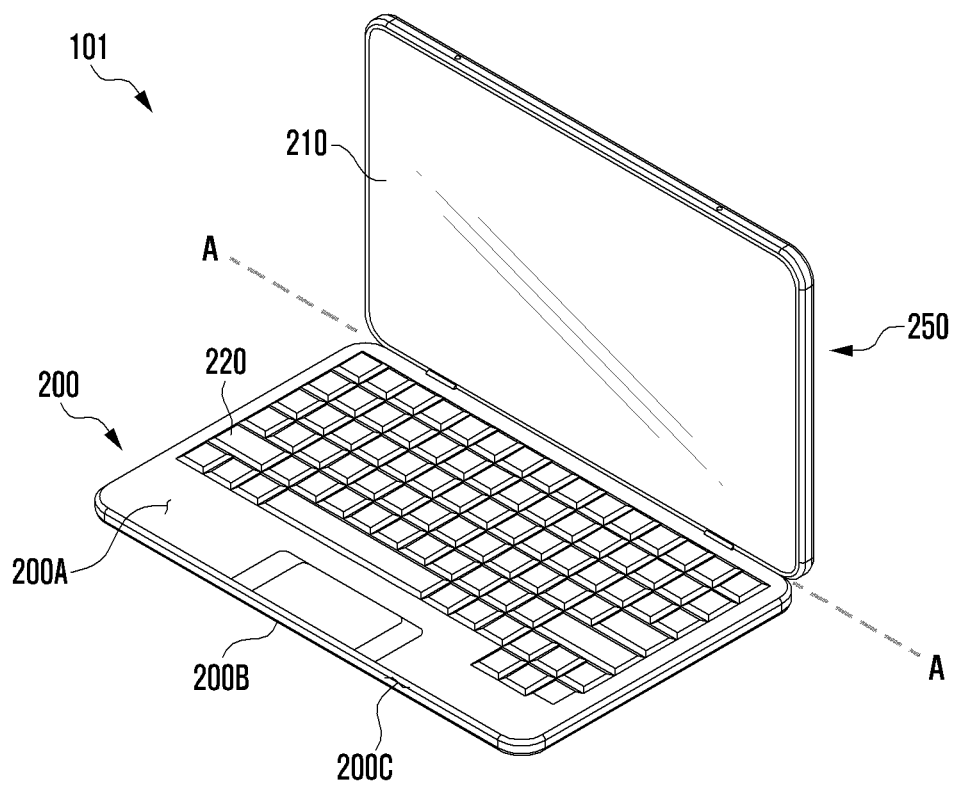
FIG. 2 is a perspective view illustrating an electronic device according to various embodiments of the disclosure.

FIG. 2 is a perspective view illustrating an electronic device 101 according to various embodiments of the disclosure.

According to various embodiments of the disclosure, the electronic device 101 may include the electronic device 101 in the form of a notebook PC, as illustrated in FIG. 2. The electronic device 101 includes a first housing 200 and a second housing 250 that may be folded to face each other. For example, the first housing 200 and the second housing 250 may be folded to face each other based on a folding axis (e.g., axis A-A illustrated in FIG. 2) of the electronic device 101. In some embodiments, in the electronic device 101, a keyboard 220 is disposed in the first housing 200 and a display module 210 (e.g., the display module 160 of FIG. 1) is disposed in the second housing 250.

In an embodiment, the first housing 200 and the second housing 250 may be disposed at both sides around the folding axis (e.g., axis A-A illustrated in FIG. 2 of the electronic device 101 and have an overall symmetrical shape with respect to the folding axis. In another embodiment, the first housing 200 and the second housing 250 may have an asymmetric shape based on the folding axis of the electronic device 101. According to whether the electronic device 101 is in an unfolded state, a folded state, or an intermediate state, an angle formed by the first housing 200 and the second housing 250 or a distance therebetween may vary.

With reference to FIG. 2, the first housing 200 according to an embodiment includes a first surface 200A, a second surface 200B, and a side surface 200C enclosing a space between the first surface 200A and the second surface 200B. The first surface 200A and the second surface 200B of the first housing 200 may be formed substantially in parallel with one another.

In an embodiment, the side surface 200C of the first housing 200 may be manufactured separately from the first surface 200A of the first housing 200 and the second surface 200B of the first housing 200, and be coupled to at least one of the first surface 200A of the first housing 200 or the second surface 200B of the first housing 200. For example, each segmented portion of the first surface 200A, the second surface 200B, and the side surface 200C of the first housing 200 may be connected in various schemes (e.g., bonding through an adhesive, bonding through welding, bolt connection). The second housing 250 may have the same constitution as that of the first housing 200. In an embodiment, the side surface 200C of the first housing 200 may be integrally formed with the first surface 200A or the second surface 200B of the first housing 200.

According to various embodiments, various connector ports (not illustrated) may be formed in the side surface 200C of the first housing 200. The connector ports include a connector port (e.g., USB connector) for transmitting and receiving power and/or data to and from an external electronic device. In some embodiments, the connector ports further include a separate connector port (e.g., ear jack hole) for performing a function of transmitting and receiving an audio signal to and from an external electronic device or for performing a function of transmitting and receiving an audio signal.

In various embodiments, the first housing 200 and the second housing 250 may be made of various materials. For example, the first housing 200 and the second housing 250 may be made of a metal material and/or a non-metal material. Here, the metal material may include an alloy such as aluminum, stainless steel (STS, SUS), iron, magnesium, or titanium, and the non-metal material may include a synthetic resin, ceramic, or engineering plastic.

In various embodiments, the first housing 200 and the second housing 250 may be manufactured using one of various schemes. For example, the first housing 200 and the second housing 250 may be formed with a method such as injection or die casting.

Shapes, materials, and forming methods of the first housing 200 and the second housing 250 illustrated in FIG. 2 described above are merely examples, and may be variously changed within a range that may be implemented by a person skilled in the art.

The electronic device 101 according to various embodiments of the disclosure described below includes a first housing 200 and a second housing 250. In some embodiments, the electronic device 101 may include only the first housing 200. Hereinafter, in describing the electronic device 101 according to various embodiments of the disclosure, the housing 200 refers to the first housing 200.

Figure 3:
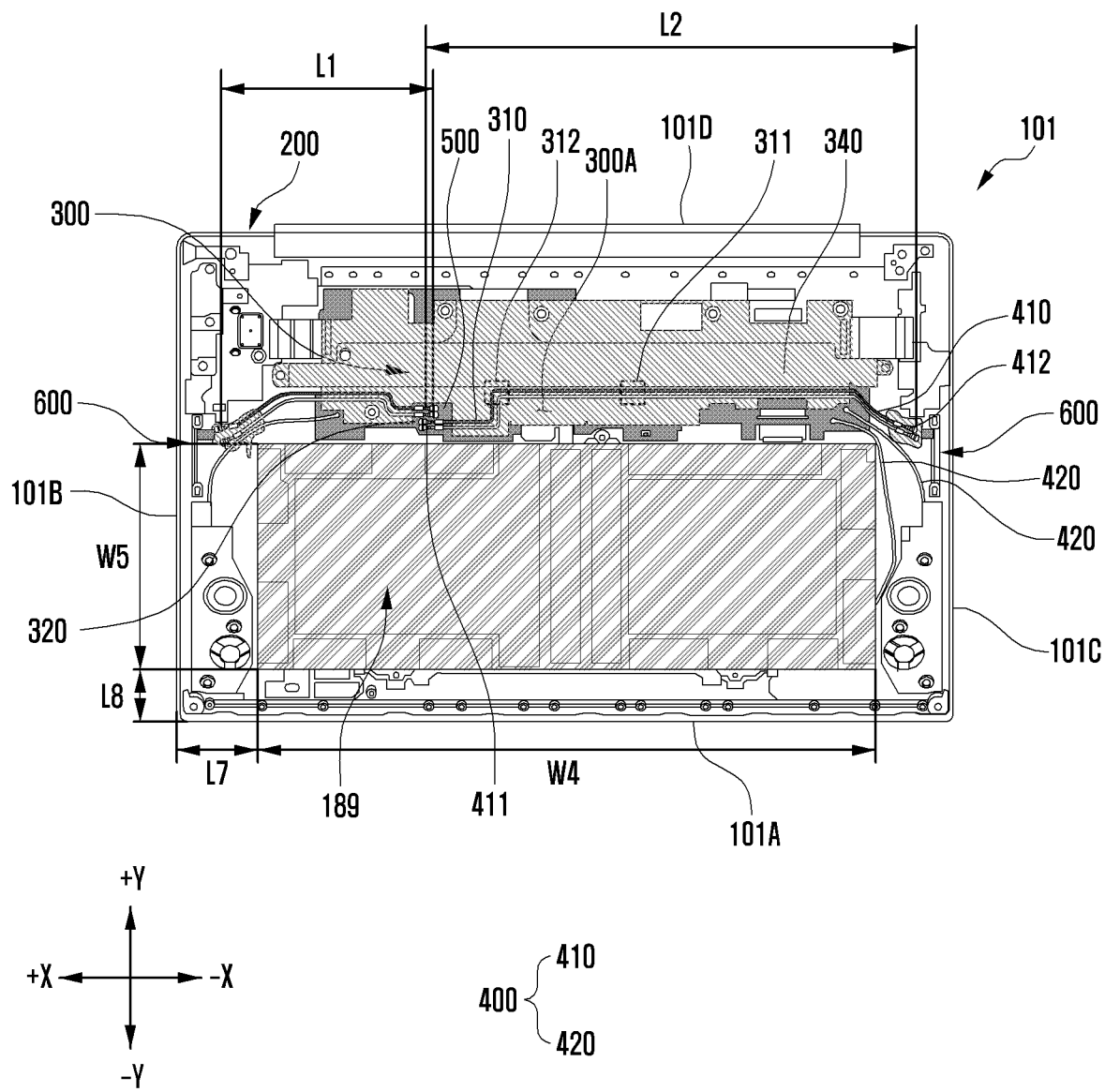
FIG. 3 is a diagram illustrating the inside of an electronic device according to various embodiments of the disclosure.

FIG. 3 is a diagram illustrating the inside of an electronic device 101 according to various embodiments of the disclosure. With reference to FIG. 3, the electronic device 101 may include a housing 200, a heat dissipation unit 300, a first cable 410, a second cable 420, a printed circuit board 500, an antenna module 600, and a battery 189.

In various embodiments, the printed circuit board 500, the antenna module 600, and the battery 189 may be disposed on one surface of the housing 200 (e.g., the first surface 200A of the housing 200 of FIG. 2).

The battery 189 is a device for supplying power to at least one component of the electronic device 101 and includes, for example, a non-rechargeable primary cell, a rechargeable secondary cell, or a fuel cell. At least a portion of the battery 189 is, for example, disposed on substantially the same plane as the printed circuit board 500. In one embodiment, the battery 189 is integrally disposed inside the electronic device 101. In another embodiment, the battery 189 is detachably affixed to the electronic device 101.

With reference to FIG. 3, a first side surface 101A of the electronic device 101 is a surface formed substantially parallel to an x-axis direction of the electronic device 101 and may face a negative y-axis direction. A second side surface 101B of the electronic device 101 is a surface formed substantially parallel to a y-axis direction of the electronic device 101 and may face a positive x-axis direction. A third side surface 101C of the electronic device 101 is a surface formed substantially parallel to the y-axis direction of the electronic device 101 and may face a negative x-axis direction. A fourth side surface 101D of the electronic device 101 is a surface formed substantially parallel to the x-axis direction of the electronic device 101 and may face a positive y-axis direction.

In various embodiments, the side surface 200C (see FIG. 2) of the housing 200 may include a first side surface 101A, a second side surface 101B, a third side surface 101C, and/or a fourth side surface 101D of the electronic device 101. For example, a surface formed parallel to the x-axis direction of the electronic device 101 in the side surface 200C (see FIG. 2) of the housing 200 and facing the negative y-axis direction is the first side surface 101A of the electronic device 101.

In various embodiments, the battery 189 may be disposed to be spaced apart from the side surface 200C (see FIG. 2) of the housing 200 by a predetermined distance L8. For example, the battery 189 may be disposed to be spaced apart from the first side surface 101A of the electronic device 101 by a predetermined distance L8. In various embodiments, the battery 189 may be disposed to be spaced apart from the second side surface 101B of the electronic device 101 by a predetermined distance L7.

In various embodiments, the battery 189 may have a length corresponding to a predetermined width in the first direction (x-axis direction) and the second direction (y-axis direction), respectively on the x-y plane. For example, the battery 189 may have a length corresponding to a fourth width W4 in the first direction (x-axis direction). The battery 189 may have a length corresponding to a fifth width W5 in the second direction (y-axis direction). The fourth width W4 of the battery 189 may be formed longer than the fifth width W5 of the battery 189. The battery may be formed in a shape including a rectangular cross-section based on an x-y cross-section, but is not limited thereto and may include various shapes.

With reference to FIG. 3, in various embodiments, the printed circuit board 500 is positioned in the second direction (y-axis direction) around the battery 189. The printed circuit board 500 is spaced apart from the battery 189 by a predetermined distance in the second direction (y-axis direction).

In various embodiments, a processor 120 (not illustrated) and a memory 130 (not illustrated) may be mounted on at least one surface of the printed circuit board 500. The processor 120 (not illustrated) may include, for example, one or more of a central processer, an application processor, a graphic processer, an image signal processor, a sensor hub processor, or a communication processor.

In various embodiments, the printed circuit board 500 may include a radio frequency circuit (RF circuit, not illustrated) on at least one surface thereof. For example, the RF circuit (not illustrated) converts and processes a baseband signal generated by the processor 120 (e.g., communication processor) into an RF signal in an intermediate frequency band (e.g., about 9 GHz to about 11 GHz). The RF circuit (not illustrated) may be electrically connected to an antenna module 600 through the first cable 410. At least a portion of the RF circuit (not illustrated) may be disposed where a board exposure area 320 of the heat dissipation unit 300 is positioned based on a position on an x-y plane.

Figure 11:
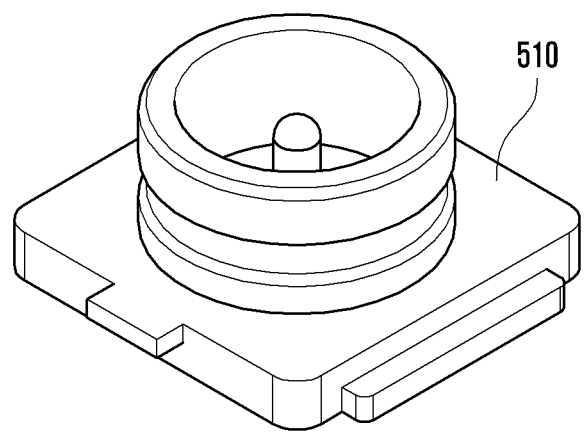
FIG. 11 is a diagram illustrating a connector for connecting a first cable and an RF circuit according to various embodiments of the disclosure.

In various embodiments, the RF circuit (not illustrated) is connected to the first cable 410 through a connector 510 (see FIG. 11). For example, the connector 510 (see FIG. 11) for connecting an electrical path of the RF circuit (not illustrated) of the printed circuit board 500 and the first cable 410 is disposed in the board exposure area 320. The first cable 410 is electrically connected to the RF circuit (not illustrated) included in one surface of the printed circuit board 500 through the connector 510 (see FIG. 11) in a board connection portion 411 (see FIG. 6) thereof.

A memory 130 (not illustrated) includes, for example, a volatile memory or a non-volatile memory. The memory 130 (not illustrated) is mounted on one surface of the printed circuit board 500.

The antenna module 600 (e.g., the antenna module 197 of FIG. 1) may include a millimeter wave antenna module. A millimeter wave may generally mean a frequency in a band of 30 to 300 GHz, and have a wavelength of 1 to 10 mm in length. By concentrating a signal in a specific direction, the millimeter wave may transmit the signal, so that the millimeter wave may increase transmission data efficiency compared to that of a lower frequency. Because of a short wavelength of millimeter waves, a transmission signal loss may occur compared to that of a lower frequency.

In various embodiments, the electronic device 101 may include a plurality of antenna modules 600. For example, the electronic device 101 may include two antenna modules 600.

In various embodiments, a first side surface of the battery 189 may be in the −x-axis direction of the battery 189 around the battery 189, and a second side surface of the battery 189 may be in the x-axis direction of the battery 189 around the battery 189. The antenna module 600 may be positioned at the first side surface (−x-axis direction) of the battery 189 and the second side surface (x-axis direction) of the battery 189 around the battery 189.

In various embodiments, the antenna module 600 may be disposed to be spaced apart from the side surface 200C of the housing 200 by a predetermined distance. For example, the antenna module 600 may be disposed to be spaced apart from the second side surface 101B of the electronic device 101 by a predetermined distance. A distance that the antenna module 600 is spaced apart from the second side surface 101B of the electronic device 101 may be smaller than a distance that the battery 189 is spaced apart from the second side surface 101B of the electronic device 101.

In various embodiments, the antenna module 600 may be disposed to be spaced apart from the third side surface 101C of the electronic device 101 by a predetermined distance. A distance that the antenna module 600 is spaced apart from the third side surface 101C of the electronic device 101 may be smaller than a distance that the battery 189 is spaced apart from the third side surface 101C of the electronic device 101.

In various embodiments, the electronic device 101 may include a cable 400 for electrically connecting respective components therein. The cable 400 may include a first cable 410 and a second cable 420.

In various embodiments, the first cable 410 may mean a cable 400 for electrically connecting the antenna module 600 and the printed circuit board 500. The electronic device 101 may include a plurality of first cables 410. One antenna module 600 may be connected to a plurality of first cables 410. At least one first cable 410 may electrically connect the antenna module 600 and the printed circuit board 500.

In various embodiments, the second cable 420 may be electrically connected to the printed circuit board 500. For example, the second cable 420 may connect a legacy antenna (not illustrated), a speaker (not illustrated), or a touch pad (not illustrated) and a corresponding area of the printed circuit board 500 corresponding thereto. The electronic device 101 may include a plurality of second cables 420.

In various embodiments, the antenna module 600 may be electrically connected to the printed circuit board 500 using the first cable 410. The first cable 410 may be electrically connected to an RF circuit (not illustrated) included in at least one surface of the printed circuit board 500.

In various embodiments, the first cable 410 may be connected to the antenna module 600 positioned at the first side surface (−x-axis direction) around the battery 189. The first cable 410 may have a second length L2 in the first direction (x-axis direction).

In various embodiments, the first cable 410 may be connected to the antenna module 600 positioned at the second side surface (x-axis direction) around the battery 189. The first cable 410 may have a first length L1 in the first direction (x-axis direction). A second length L2 of the first cable 410 may be formed longer than the first length L1 of the first cable 410.

In various embodiments, the heat dissipation unit 300 may be used for cooling a heat generated from internal components of the electronic device 101. For example, the heat dissipation unit 300 may be in the form of a plate that transfers a heat, and be overlapped at one surface of the printed circuit board 500. By diffusing a heat generated from the printed circuit board 500, the heat dissipation unit 300 may lower an internal temperature of the electronic device 101.

In various embodiments, the heat dissipation unit 300 may include a heat pipe (not illustrated) and a heat sink (not illustrated). The heat pipe (not illustrated) may transfer a heat from a heat source to the heat sink (not illustrated). The heat sink (not illustrated) removes the transferred heat.

In various embodiments, the heat dissipation unit 300 may be disposed in at least one surface of the printed circuit board 500. For example, the heat dissipation unit 300 may be positioned in a negative z-axis direction (see FIG. 5) around the printed circuit board 500.

With reference to FIG. 3, in various embodiments, the heat dissipation unit 300 may form a cable seating path 310 in which at least a portion of the first cable 410 may be seated at one surface 300A thereof. The cable seating path 310 may include a straight area 311 in which the first cable 410 may be seated in a straight line. For example, the first cable 410 may be disposed parallel to the first direction (x-axis direction) in the straight area 311 of the cable seating path 310.

In various embodiments, the cable seating path 310 may include a bending area 312, which is an area in which the first cable 410 is bent to change a direction. For example, in a bending area 312, the first cable 410 may be disposed parallel to the first direction (x-axis direction) of the cable seating path 310 and then change a direction and disposed parallel to the second direction (y-axis direction).

Figure 4:
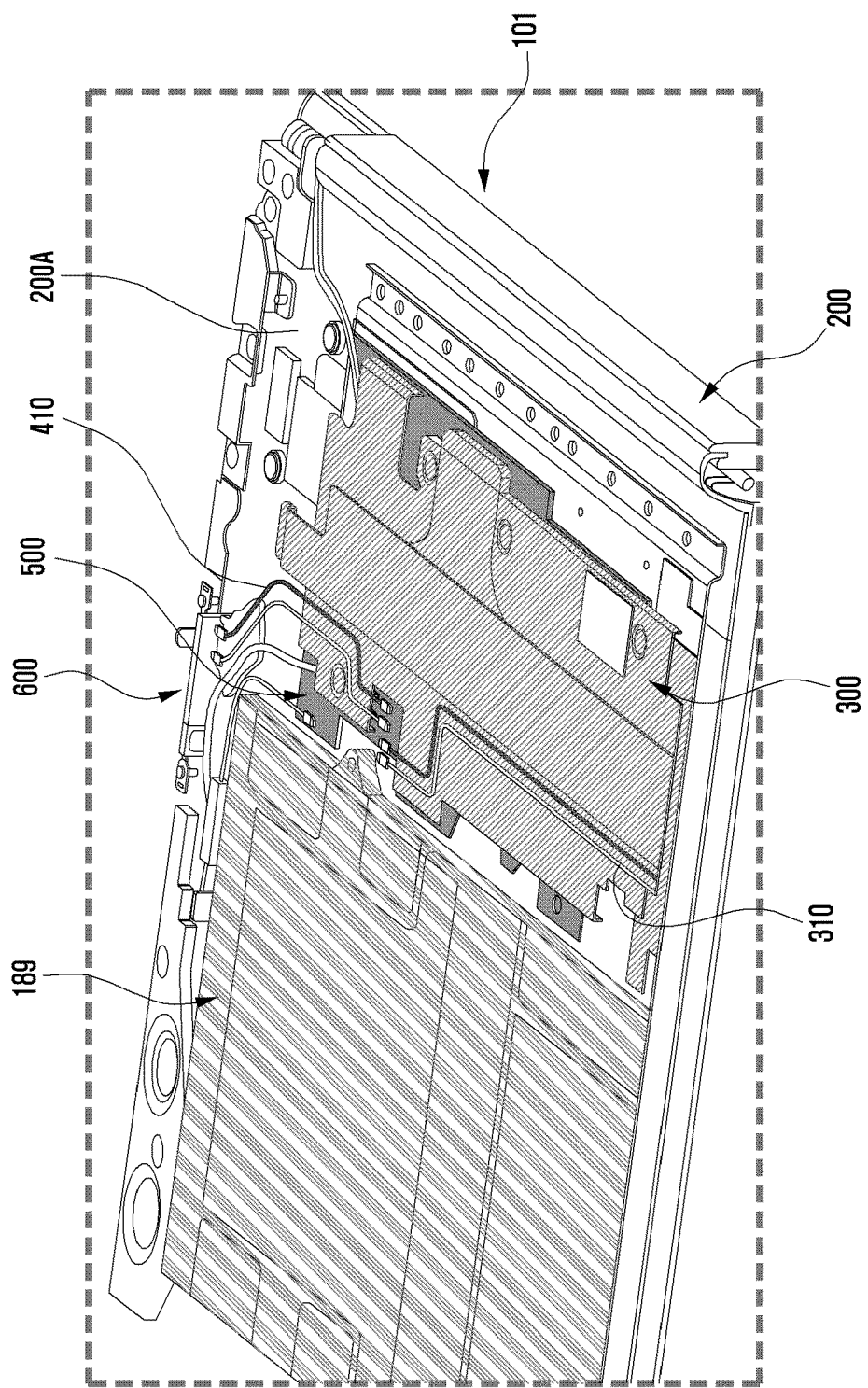
FIG. 4 is a perspective view illustrating the inside of an electronic device according to various embodiments of the disclosure.

FIG. 4 is a perspective view illustrating the inside of an electronic device 101 according to various embodiments of the disclosure.

With reference to FIG. 4, in various embodiments, a battery 189 and a printed circuit board 500 may be disposed at one surface of the housing 200. For example, the first surface 200A of the housing 200 may be positioned in a third direction (z-axis direction) of the battery 189 and the printed circuit board 500.

With reference to FIG. 4, in various embodiments, the printed circuit board 500 and the heat dissipation unit 300 may be positioned in a second direction (y-axis direction) around the battery 189.

The heat dissipation unit 300 may be disposed at one surface of the printed circuit board 500. For example, the printed circuit board 500 may be positioned in a third direction (z-axis direction) of the heat dissipation unit 300.

In various embodiments, in order to include a heat pipe (not illustrated) and a heat sink (not illustrated), the heat dissipation unit 300 may have a predetermined length in the third direction (z-axis direction). The heat dissipation unit 300 may have a thickness as much as a predetermined length in the third direction (z-axis direction), thereby forming a cable seating path 310 in which the first cable 410 may be disposed.

The first cable 410 may be connected to the antenna module 600 at one end and be connected to the printed circuit board 500 at the other end. The first cable 410 may be disposed in the cable seating path 310 formed at one surface of the heat dissipation unit 300.

Figure 5:
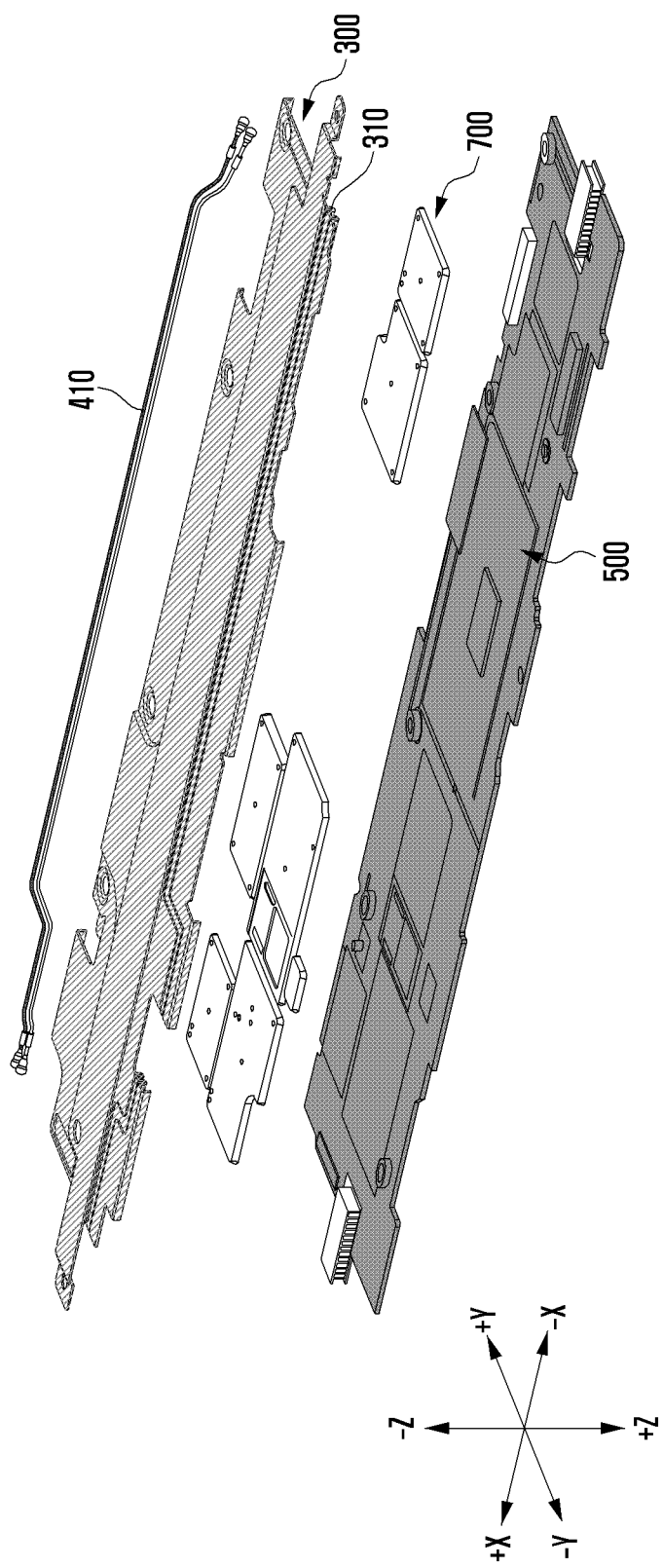
FIG. 5 is an exploded perspective view illustrating a positional relationship between a heat dissipation unit and a printed circuit board according to various embodiments of the disclosure.

FIG. 5 is an exploded perspective view illustrating a positional relationship between a heat dissipation unit 300 and a printed circuit board 500 according to various embodiments of the disclosure.

With reference to FIG. 5, in various embodiments, components inside the electronic device 101 may be disposed in order of the printed circuit board 500, a shield member 700, the heat dissipation unit 300, and the first cable 410 in a negative z-axis direction.

With reference to FIG. 5, in various embodiments, the printed circuit board 500 may be positioned in a third direction (z-axis direction) around the shield member 700. The shield member 700 may be positioned in the third direction (z-axis direction) around the heat dissipation unit 300.

In various embodiments, a plurality of electronic components (not illustrated) may be mounted at one surface of the printed circuit board 500. When the electronic device 101 operates, an electromagnetic wave may be generated from an electronic component (not illustrated). Electromagnetic waves may cause problems due to electromagnetic interference between respective electronic components (not illustrated). The shield member 700 is configured to enclose a plurality of electronic components (not illustrated) mounted at one surface of the printed circuit board 500 from the outside. The shield member 700 is configured to block electromagnetic waves generated from electronic components (not illustrated) to prevent a problem from occurring due to electromagnetic interference.

In various embodiments, the heat dissipation unit 300 may form a cable seating path 310 at one surface. At least a portion of the first cable 410 may be seated in the cable seating path 310 of the heat dissipation unit 300. The cable seating path 310 may have a predetermined height in the third direction (z-axis direction).

Figure 6:
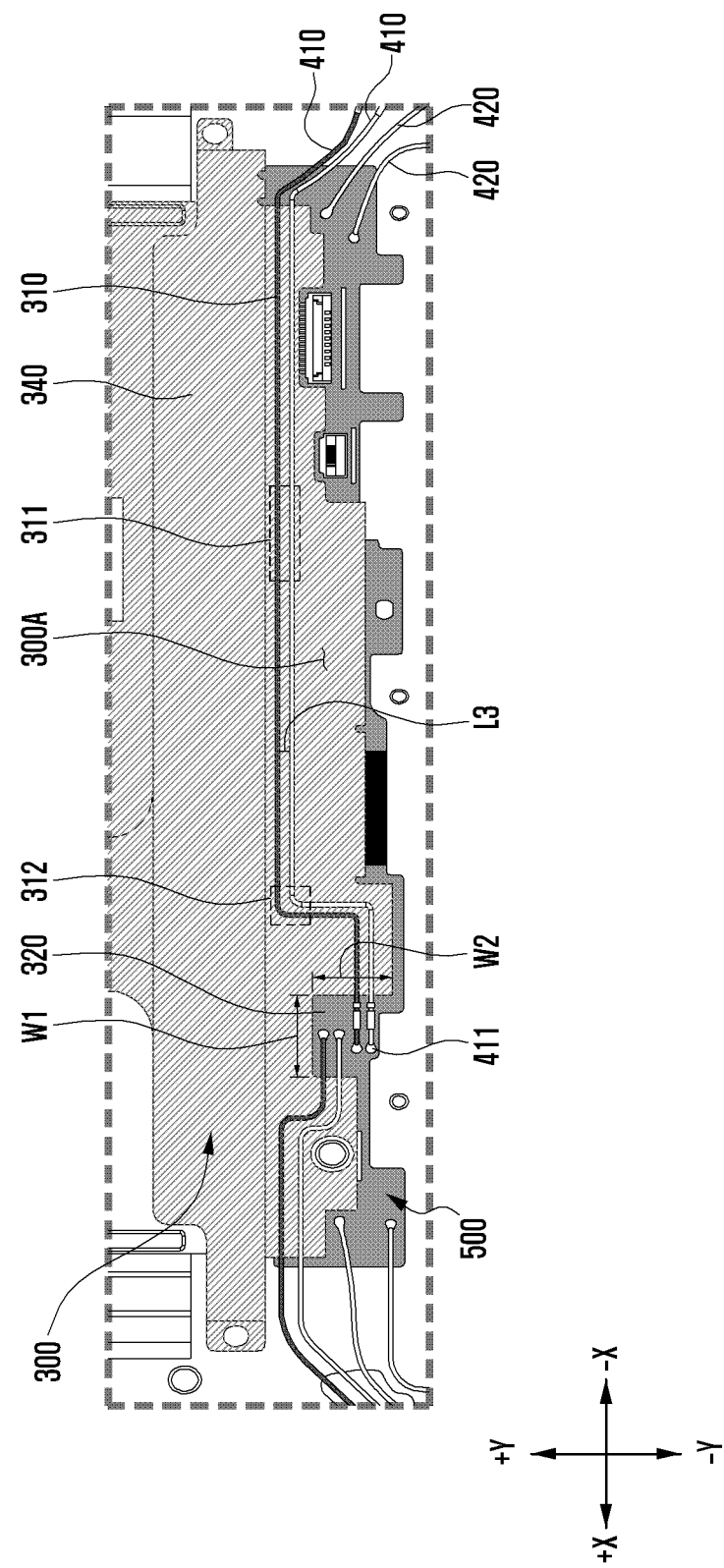
FIG. 6 is a diagram illustrating a first cable disposed at one surface of a heat dissipation unit according to various embodiments of the disclosure.

FIG. 6 is a diagram illustrating a first cable 410 disposed at one surface 300A of a heat dissipation unit 300 according to various embodiments of the disclosure.

With reference to FIG. 6, in various embodiments, the first cable 410 may be seated in the cable seating path 310 formed at one surface 300A of the heat dissipation unit 300.

In various embodiments, the cable seating path 310 may include a straight area 311, which is an area in which the first cable 410 is seated in a straight line, and a bending area 312, which is an area in which the first cable 410 is bent to change a direction. The cable seating path 310 may be formed to connect from one side (side surface in a −x-axis direction) of the heat dissipation unit 300 to one side (side surface in a −x-axis direction) of the board exposure area 320 of the heat dissipation unit 300. The cable seating path 310 may be formed to connect from the other side (side surface in x-axis direction) of the heat dissipation unit 300 to the other side (x-axis direction) of the board exposure area 320 of the heat dissipation unit 300.

In various embodiments, the electronic device 101 may form a plurality of cable seating paths 310 at one surface 300A of the heat dissipation unit 300. With reference to FIG. 6, a plurality of cable seating paths 310 may be formed in parallel with a predetermined distance L3 between each cable seating path 310. The heat dissipation unit 300 may form a plurality of cable seating paths 310 in the positive x-axis direction and the negative x-axis direction around the board exposure area 320.

According to an embodiment of the disclosure, the heat dissipation unit 300 may form two cable seating paths 310 in the negative x-axis direction around the board exposure area 320. The two first cables 410 may be respectively disposed in the two cable seating paths 310 located in the negative x-axis direction around the board exposure area 320. According to an embodiment, because the two cable seating paths 310 are spaced apart by a predetermined distance L3, the two first cables 410 may be spaced apart by a predetermined distance L3 and disposed in parallel.

In another embodiment, the heat dissipation unit 300 may form one cable seating path 310 at one surface 300A thereof. For example, the heat dissipation unit 300 may form one cable seating path 310 in the negative x-axis direction around the board exposure area 320. When only one cable seating path 310 is formed at one surface 300A of the heat dissipation unit 300, a plurality of first cables 410 may be disposed together in one cable seating path 310. For example, when the electronic device 101 includes two first cables 410, the two first cables 410 may be disposed together in one cable seating path 310.

With reference to FIG. 6, in various embodiments, the heat dissipation unit 300 may form an upper end layer 340 in at least a portion thereof. The upper end layer 340 may be a portion formed in a predetermined height in a direction away from one surface 300A of the heat dissipation unit 300.

In various embodiments, the upper end layer 340 may include a heat pipe (not illustrated) capable of transferring a heat from a heat source to a heat sink (not illustrated) and a heat sink (not illustrated) capable of removing the transferred heat. A cable seating path 310 may be formed at one side (negative y-axis direction) of the upper end layer 340. With reference to FIG. 6, the cable seating path 310 may be positioned to be spaced apart by a predetermined distance at one side (negative y-axis direction) of the upper end layer 340.

With reference to FIG. 6, in various embodiments, the first cable 410 may be disposed not to cross each other with the second cable 420. For example, the first cable 410 may be positioned in the second direction (y-axis direction) around the second cable 420 without being crossing each other with the second cable 420. The second cable 420 may be connected to the printed circuit board 500 without being disposed at the heat dissipation unit 300.

With reference to FIG. 6, in various embodiments, the first cable 410 may be connected to the antenna module 600 (see FIG. 7) at one end and to the printed circuit board 500 at the other end. The first cable 410 may form a board connection portion 411 at the other end connected to the printed circuit board 500. The first cable 410 may be connected to an RF circuit (not illustrated) included in the printed circuit board 500 at the board connection portion 411.

With reference to FIG. 6, in various embodiments, the heat dissipation unit 300 may be disposed at one surface of the printed circuit board 500. Because the first cable 410 is disposed in the cable seating path 310 formed at one surface of the heat dissipation unit 300, in order for the first cable 410 to be connected to the printed circuit board 500, one surface of the printed circuit board 500 should be exposed in at least a portion of the heat dissipation unit 300.

In various embodiments, the heat dissipation unit 300 may include a board exposure area 320 in which one surface of the printed circuit board 500 may be exposed in at least a portion thereof. The heat dissipation unit 300 may form a board exposure area 320 at a position of the board connection portion 411 of the first cable 410 so that the first cable 410 may be connected to the printed circuit board 500.

In various embodiments, the board exposure area 320 may have a length of the first width W1 parallel to the first direction (x-axis direction). The board exposure area 320 may have a length of the second width W2 parallel to the second direction (y-axis direction). The board exposure area 320 may expose at least a portion of the printed circuit board 500 positioned in the third direction (z-axis direction) of the heat dissipation unit 300.

In various embodiments, the plurality of first cables 410 may be disposed without intersecting the board exposure area 320.

In various embodiments, the first cable 410 may form a board connection portion 411 having a predetermined length in the first direction (x-axis direction) so as to be electrically connected to the printed circuit board 500. The board connection portion 411 of the first cable 410 may be positioned in the board exposure area 320 formed in the heat dissipation unit 300, and be connected to an RF circuit (not illustrated) included in the printed circuit board 500. A length of the first width W1 of the board exposure area 320 may be formed longer than that of the first direction (x-axis direction) of the board connection portion 411 of the first cable 410 disposed in the board exposure area 320.

Figure 7:
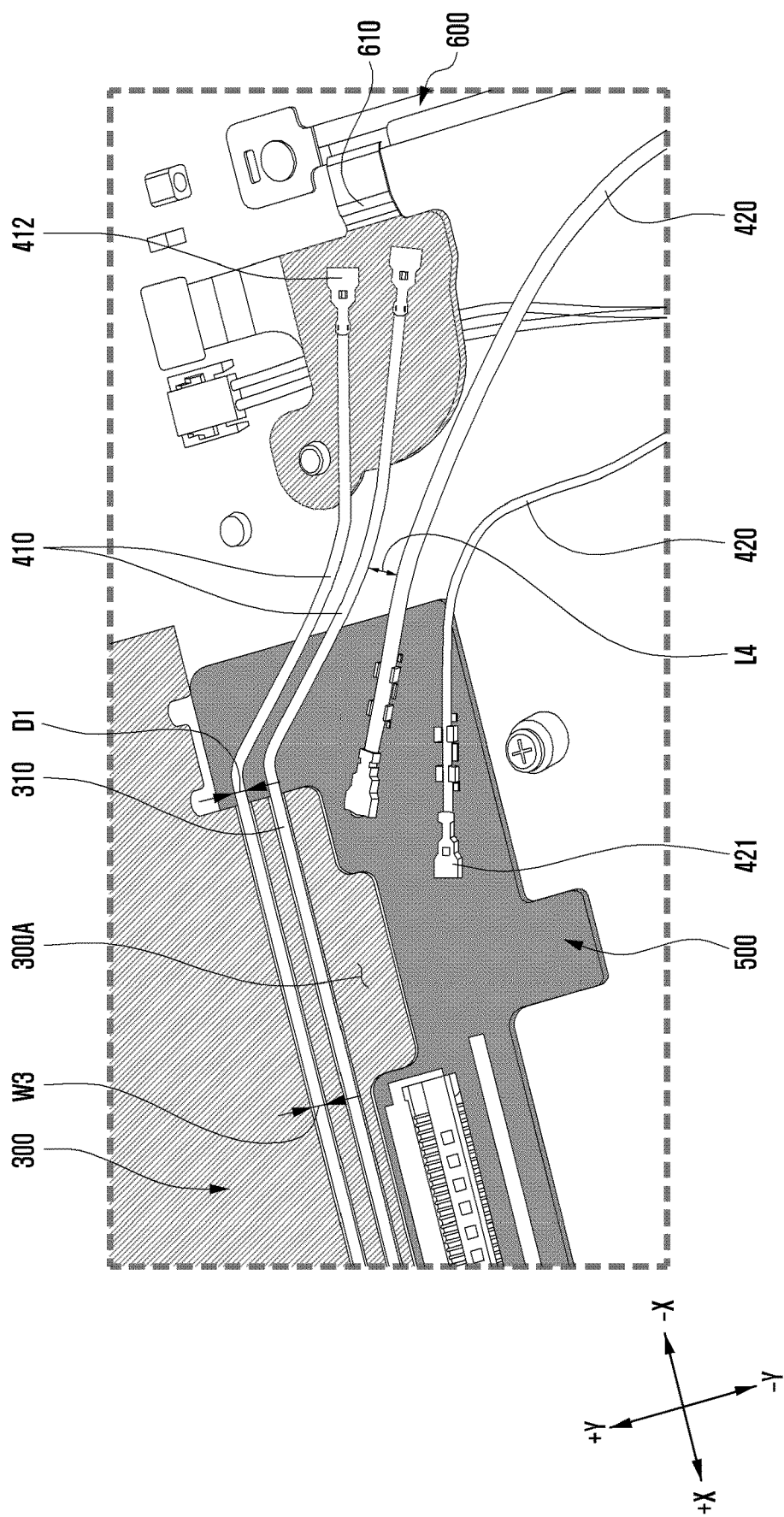
FIG. 7 is a diagram illustrating a first cable and a second cable according to various embodiments of the disclosure.

FIG. 7 is a diagram illustrating a first cable 410 and a second cable 420 according to various embodiments of the disclosure.

When a space in which the first cable 410 and the second cable 420 may be disposed in is narrow in the electronic device 101, the first cable 410 and the second cable 420 may cross each other. When the first cable 410 and the second cable 420 cross each other, a resonance phenomenon may occur; thus, a performance of the electronic device 101 may be deteriorated.

When a cable seating path 310 is formed at one surface 300A of the heat dissipation unit 300 according to various embodiments of the disclosure and the first cable 410 is disposed in the cable seating path 310, the first cable 410 and the second cable 420 may be spaced apart from each other by a predetermined distance or more. For example, with reference to FIG. 7, a portion in which the first cable 410 and the second cable 420 are spaced closest to each other may have a distance equal to the fourth length L4. For example, the fourth length L4 may be formed greater than a diameter D1 of the first cable 410 and a diameter of the second cable 420.

In the electronic device 101 according to various embodiments of the disclosure, even in the case that a space in which the first cable 410 and the second cable 420 may be disposed in is narrow in the electronic device 101, the first cable 410 and the second cable 420 may have a distance greater than or equal to the fourth length L4, thereby preventing degradation of a performance of the electronic device 101 due to crossing of the first cable 410 and the second cable 420.

In various embodiments, the first cable 410 may be connected to the antenna module 600 at one end and be connected to the printed circuit board 500 at the other end. The first cable 410 may be electrically connected to the antenna module 600 at an antenna connection portion 412 thereof.

In various embodiments, the first cable 410 may be disposed in the cable seating path 310 formed at one surface 300A of the heat dissipation unit 300. A width W3 of the cable seating path 310 may be formed greater than a diameter D1 of the first cable 410.

In some embodiments, a plurality of first cables 410 may be disposed together in one cable seating path 310. In this case, the width W3 of the cable seating path 310 may be formed to be larger than the sum of the diameters D1 of the plurality of first cables 410. For example, when one cable seating path 310 is formed at one surface 300A of the heat dissipation unit 300 and two first cables 410 are disposed in one cable seating path 310, the width W3 of the cable seating path 310 may be formed to be larger than the sum of diameters D1 of the two first cables 410.

In various embodiments, the width W3 of at least a partial area of the cable seating path 310 may be formed to be smaller than the diameter D1 of the first cable 410 or the sum of the diameters D1 of the plurality of first cables 410 (e.g., in case that the plurality of first cables 410 are disposed at the cable seating path 310). In at least a partial area of the cable seating path 310, because the width W3 of the cable seating path 310 is formed to be smaller than the diameter D1 of the first cable 410 or the sum of the diameters D1 of the plurality of first cables 410, the first cable 410 may be fixed without forming an extra space inside the cable seating path 310.

In various embodiments, the second cable 420 may be connected to the printed circuit board 500 without being disposed at one surface 300A of the heat dissipation unit 300. The second cable 420 may form a connection area 421 at one end thereof. The second cable 420 may be electrically connected to the printed circuit board 500 in the connection area 421.

In various embodiments, the antenna module 600 may be electrically connected to the antenna connection portion 412 of the first cable 410 using a flexible printed circuit board (FPCB) 610. The FPCB 610 may include a conductive material to electrically connect the antenna module 600 to the first cable 410. The FPCB 610 may include a flexible material to have flexibility.

In various embodiments, the cable seating path 310 may include a protrusion member (not illustrated) therein. The protrusion member (not illustrated) is configured to fix the first cable 410 at the cable seating path 310 at a regular position. The protrusion member (not illustrated) may serve as a ground of the first cable 410. The cable seating path 310 may include a plurality of protrusion members (not illustrated) therein. In an embodiment, the width W3 of at least a partial area of the cable seating path 310 may be formed to be smaller than the diameter D1 of the first cable 410.

Figure 8:
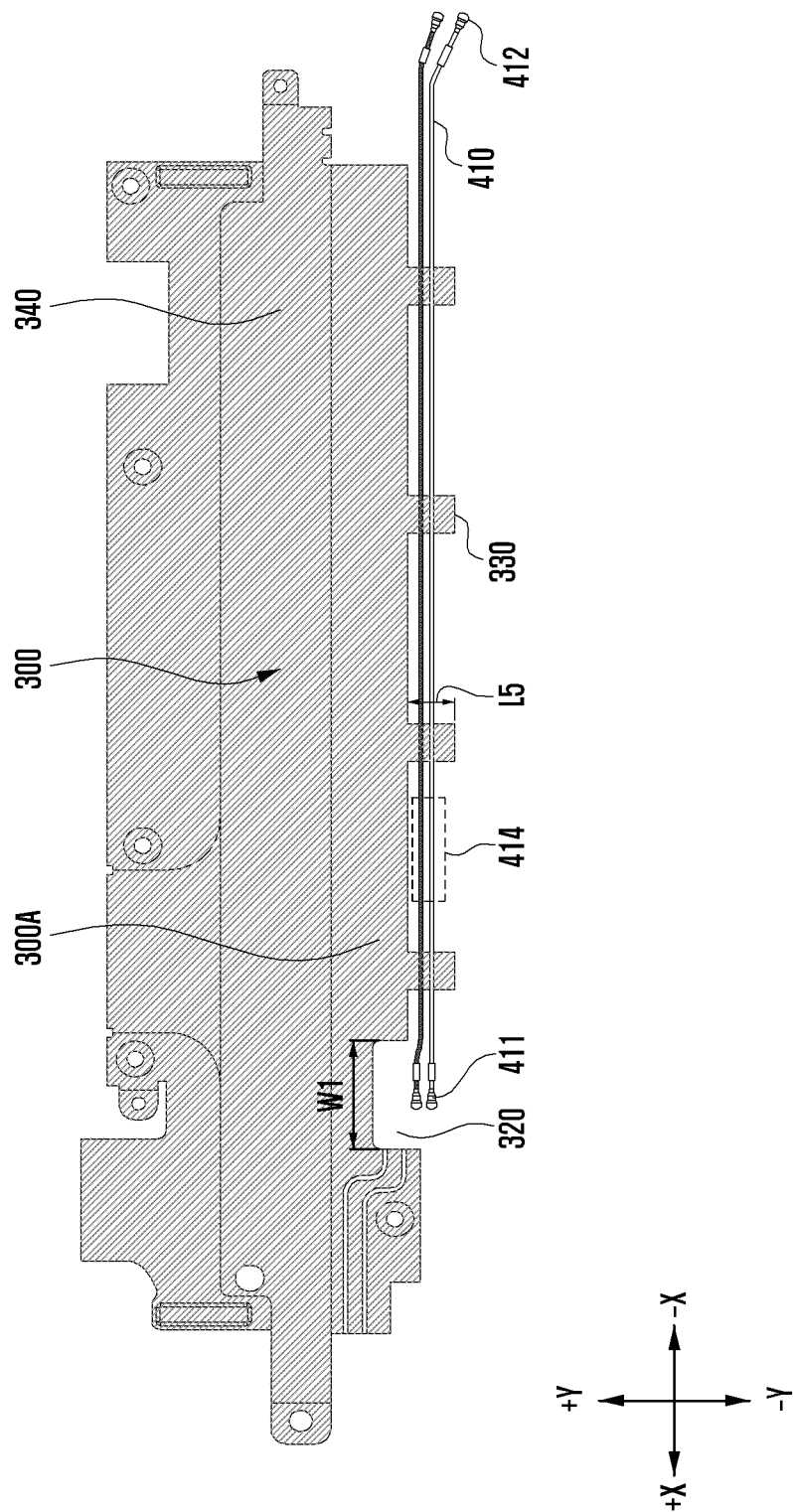
FIG. 8 is a diagram illustrating a disposition relationship between a heat dissipation unit and a first cable according to an embodiment of the disclosure.

FIG. 8 is a diagram illustrating a disposition relationship between a heat dissipation unit 300 and a first cable 410 according to an embodiment of the disclosure.

The heat dissipation unit 300 according to an embodiment of the disclosure may form a protrusion area 330 protruded by a predetermined length at one side (negative y-axis direction) thereof. The protrusion area 330 may be formed to protrude from one side (negative y-axis direction) of the heat dissipation unit 300 by a fifth length L5.

The protruding area 330 of the heat dissipation unit 300 according to an embodiment of the disclosure may be an area added to increase a heat dissipation area in the heat dissipation unit 300. The protruding area 330 of the heat dissipation unit 300 may be an area for connecting the heat dissipation unit 300 to another conductive member (e.g., the printed circuit board 500 (see FIG. 5)) inside the electronic device 101.

The first cable 410 may be disposed in at least a portion of the protruding area 330 according to an embodiment of the disclosure. A fifth length L5 of the protruding area 330 may be formed to be longer than the sum of diameters D1 of the plurality of first cables 410.

The heat dissipation unit 300 according to an embodiment of the disclosure may include a plurality of protruding areas 330. For example, with reference to FIG. 8, the heat dissipation unit 300 according to an embodiment may include four protruding areas 330 at one side (negative y-axis direction) thereof. Although FIG. 8 illustrates that the heat dissipation unit 300 includes four protruding areas 330, the number of protruding areas 330 included in the heat dissipating unit 300 is not limited thereto. The protrusion area 330 included in the heat dissipation unit 300 may be constituted in various shapes.

The plurality of protrusion areas 330 according to an embodiment of the disclosure may be formed to be spaced apart from each other by a predetermined distance between each protrusion area 330. The plurality of protrusion areas 330 may be formed to protrude from one side (negative y-axis direction) of the heat dissipation unit 300 by a fifth length L5.

The first cable 410 may be disposed in at least a portion of the protruding area 330 according to an embodiment of the disclosure. In order to electrically connect the antenna module 600 and the printed circuit board 500, the first cable 410 may be connected from the antenna connection portion 412 to the board connection portion 411. At least a portion of the first cable 410 may be disposed in the protruding area 330 of the heat dissipation unit 300 between the board connection portion 411 and the antenna connection portion 412 of the first cable 410.

The first cable 410 according to an embodiment of the disclosure may include a cable straight area 414 connected in a straight line between each protrusion area 330. The first cable 410 may be extended in a straight line in the first direction (x-axis direction) in the cable straight area 414.

In various embodiments, the heat dissipation unit 300 may be disposed at one surface of the printed circuit board 500 (see FIG. 3). In order for the first cable 410 to be connected to the printed circuit board 500 (see FIG. 3), one surface of the printed circuit board 500 (see FIG. 3) may be exposed in at least a portion of the heat dissipation unit 300.

In various embodiments, the heat dissipation unit 300 may include a board exposure area 320 in which one surface of the printed circuit board 500 (see FIG. 3) may be exposed in at least a portion thereof. The heat dissipation unit 300 may form a board exposure area 320 at a position of the board connection portion 411 of the first cable 410 so that the first cable 410 may be connected to the printed circuit board 500 (see FIG. 3).

At least a portion of the printed circuit board 500 (see FIG. 3) may be exposed to the outside in the board exposure area 320. The first cable 410 may be electrically connected to the printed circuit board 500 (see FIG. 3) exposed in the board exposure area 320 of the heat dissipation unit 300 at the board connection portion 411.

The board exposure area 320 according to an embodiment of the disclosure may have a length of a first width W1 to be parallel to the first direction (x-axis direction). The board exposure area 320 may expose at least a portion of the printed circuit board 500 (see FIG. 3) positioned in a third direction (z-axis direction) of the heat dissipation unit 300.

The plurality of first cables 410 may be disposed parallel to each other without intersecting each other in the board exposure area 320. The first cable 410 may form a board connection portion 411 having a predetermined length in the first direction (x-axis direction) so as to be electrically connected to the printed circuit board 500. A length of the first width W1 of the board exposure area 320 may be formed longer than that of the board connection portion 411 of the first cable 410 disposed in the board exposure area 320 in the first direction (x-axis direction).

Figure 9:
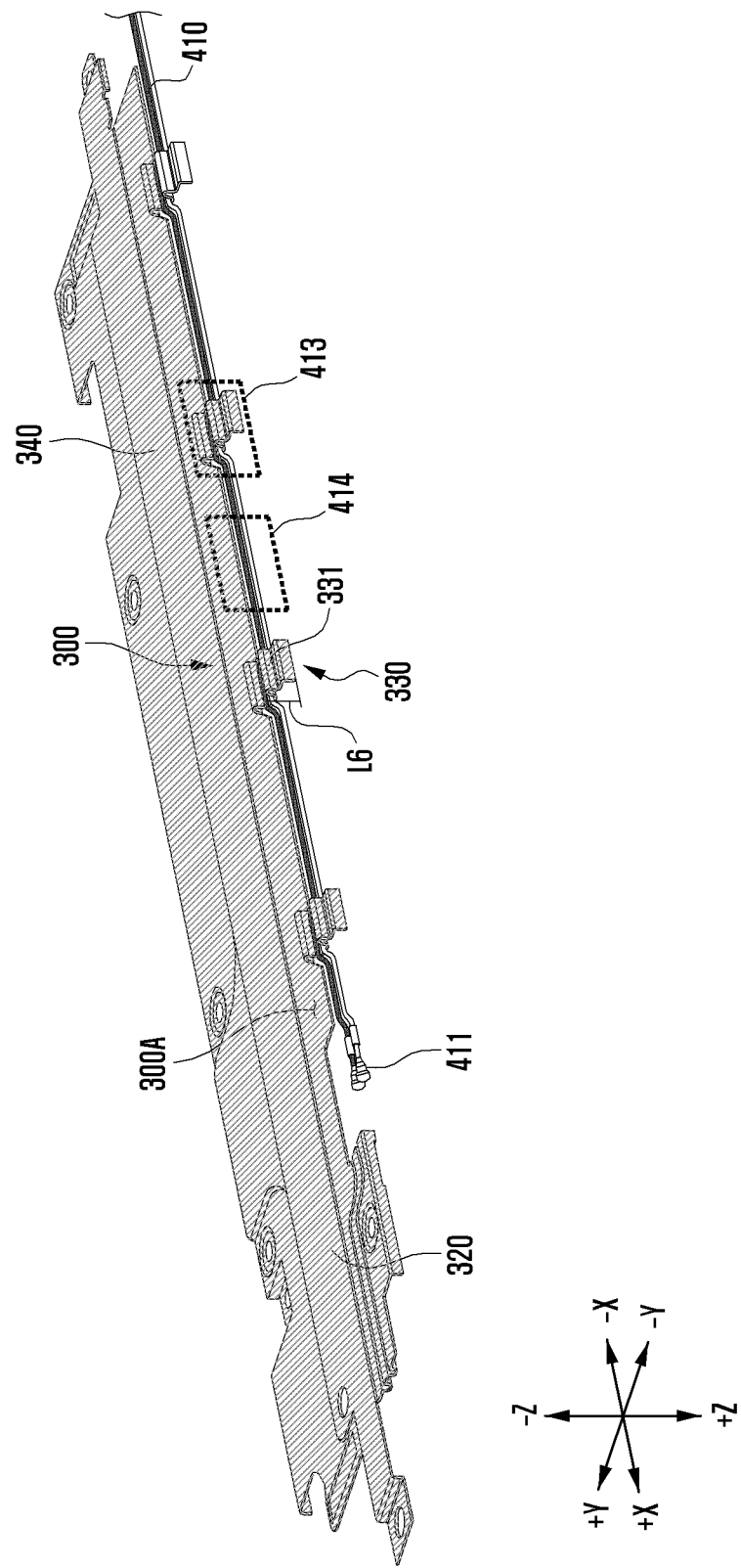
FIG. 9 is a perspective view illustrating a disposition relationship between a protruding area of a heat dissipation unit and a first cable according to an embodiment of the disclosure.

FIG. 9 is a perspective view illustrating a disposition relationship between a protruding area 330 of a heat dissipation unit 300 and a first cable 410 according to an embodiment of the disclosure.

With reference to FIG. 9, the protruding area 330 of the heat dissipation unit 300 may have a predetermined height at one surface of the heat dissipation unit 300. For example, the protrusion area 330 may have a height of a sixth length L6 in a direction (negative z-axis direction) away from one surface 300A of the heat dissipation unit 300.

The protruding area 330 of the heat dissipation unit 300 according to an embodiment of the disclosure may include a cable seating area 331. The cable seating area 331 may include a space in which the first cable 410 may be disposed. At least a portion of the first cable 410 may be disposed in the cable seating area 331 of the protruding area 330.

The electronic device 101 according to an embodiment of the disclosure may include a plurality of first cables 410. At least a portion of the plurality of first cables 410 may be disposed together in the cable seating area 331 of the protruding area 330. In the cable seating area 331, the plurality of first cables 410 may be disposed to be spaced apart from each other by a predetermined distance. For example, the electronic device 101 may include two first cables 410. When the electronic device 101 includes two first cables 410, at least a portion of the two first cables 410 may be disposed together to be spaced apart from each other in the cable seating area 331.

The first cable 410 according to an embodiment of the disclosure may include an antenna connection portion 412, a board connection portion 411, a cable bending area 413, and a cable straight area 414. The first cable 410 may be formed in a straight line in the first direction (x-axis direction) in the cable straight area 414. The first cable 410 may include a cable bending area 413, which an area bent to be seated in the cable seating area 331 of the protruding area 330. The first cable 410 may be bent in the positive z-axis or negative z-axis direction in the cable bending area 413 and be seated in the cable seating area 331 of the protruding area 330.

In some embodiments, the protruding area 330 may be formed in a height of a sixth length L6 in a direction (negative z-axis direction) away from one surface 300A of the heat dissipation unit 300, and be an area protruded to one side (negative y-axis direction) of the heat dissipation unit 300 in the same height as the heat dissipation unit 300 (length in a negative z-axis direction), for example, the same height as the upper end layer 340 (length in a negative z-axis direction). The protruding area 330 according to some embodiments may form a cable seating path 310 (see FIG. 5) in at least a portion thereof. In this case, the first cable 410 may be connected in a straight line from the antenna connection portion 412 to the board connection portion 411 through the cable straight area 414, and be seated in the cable seating path 310 of the protruding area 330 (see FIG. 5).

The first cable 410 according to an embodiment of the disclosure may be spaced apart from the second cable 420 (see FIG. 7) by a predetermined distance or more.

Figure 10:
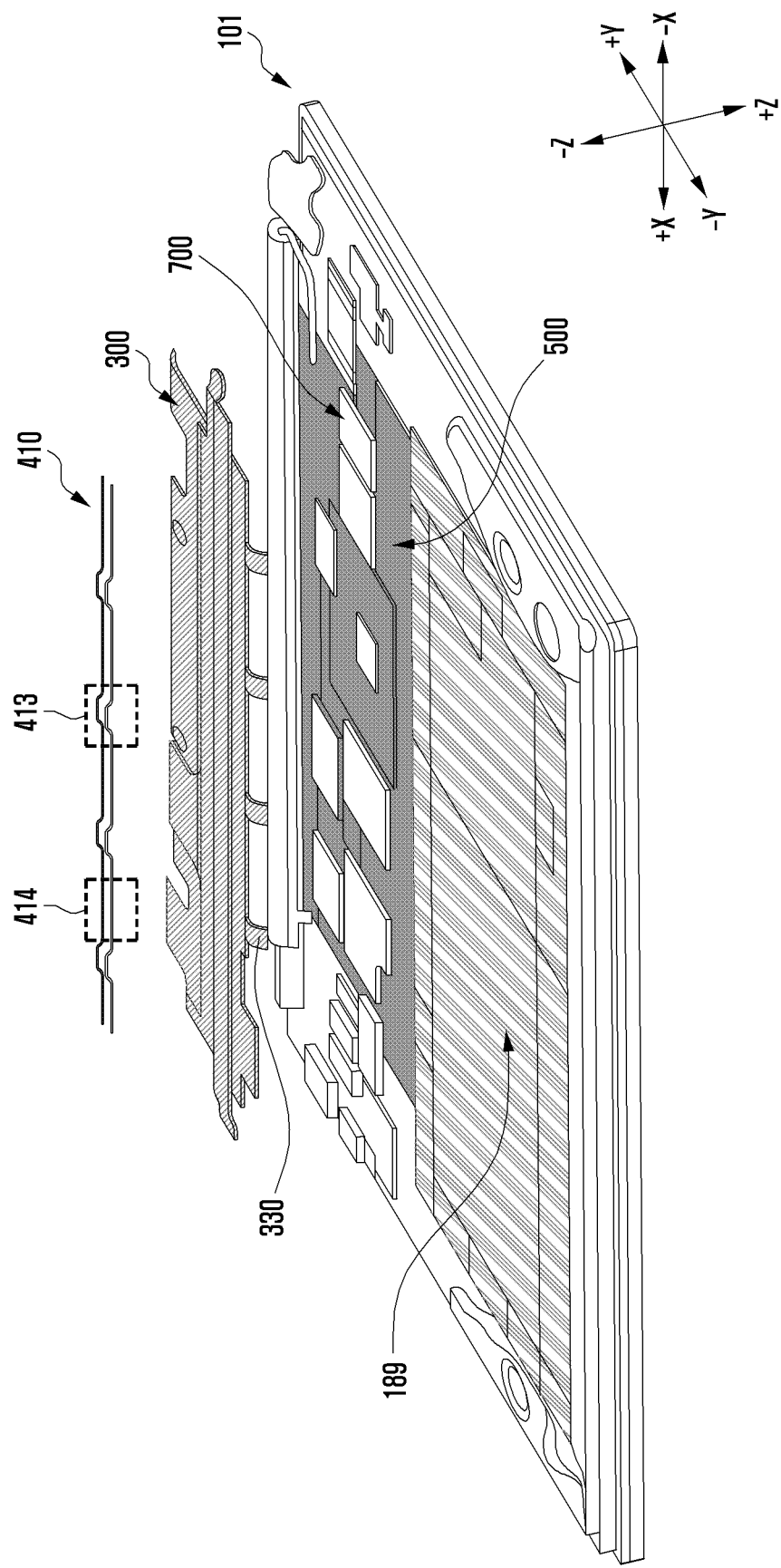
FIG. 10 is an exploded perspective view illustrating a positional relationship between a printed circuit board, a heat dissipation unit, and a first cable in an electronic device according to an embodiment of the disclosure.

FIG. 10 is an exploded perspective view illustrating a relative positional relationship between a printed circuit board 500, a heat dissipation unit 300, and a first cable 410 in an electronic device 101 according to an embodiment of the disclosure.

With reference to FIG. 10, in the electronic device 101 according to an embodiment of the disclosure, the printed circuit board 500 may be positioned in a second direction (y-axis direction) around the battery 189. The shield member 700 may be disposed at one surface of the printed circuit board 500.

In the electronic device 101 according to an embodiment of the disclosure, the printed circuit board 500 may be positioned in a third direction (z-axis direction) around the heat dissipation unit 300. At least a portion of the first cable 410 may be disposed in the protruding area 330 of the heat dissipation unit 300. The first cable 410 may be connected in the first direction (x-axis direction), and include a cable straight area 414 and a cable bending area 413.

In the electronic device 101 according to an embodiment of the disclosure, the number of cable bending areas 413 of the first cable 410 may be the same as the number of the protruding areas 330 of the heat dissipation unit 300. The cable bending area 413 of the first cable 410 may be positioned in the protruding area 330 of the heat dissipation unit 300.

FIG. 11 is a diagram illustrating a connector 510 for connecting a first cable 410 (see FIG. 6) and an RF circuit (not illustrated) according to various embodiments of the disclosure.

In various embodiments, the RF circuit (not illustrated) included in one surface of the printed circuit board 500 (see FIG. 6) may be connected to the first cable 410 (see FIG. 6) through the connector 510. The connector 510 according to various embodiments of the disclosure may be disposed in the board exposure area 320 (see FIG. 6) to connect the first cable 410 (see FIG. 6) and an electrical path of the RF circuit (not illustrated) included in the printed circuit board 500 (see FIG. 6). For example, the connector 510 may be disposed at the board connection portion 411 (see FIG. 6) of the first cable 410 (see FIG. 6), and the first cable 410 (see FIG. 6) and the RF circuit (not illustrated) included in one surface of the printed circuit board 500 through the connector 510 may be electrically connected to each other.

The electronic device according to various embodiments of the disclosure may be one of various types of electronic devices. The electronic devices may include, for example, a portable communication device (e.g., a smartphone), a computer device, a portable multimedia device, a portable medical device, a camera, a wearable device, or a home appliance. The electronic devices according to embodiments of the disclosure are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B", "at least one of A and B", "at least one of A or B", "A, B, or C", "at least one of A, B, and C", and "at least one of A, B, or C" may include any one of, or all possible combinations of the items enumerated together in a corresponding one of the phrases. As used herein, such terms as "1st" and "2nd", or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with", "coupled to", "connected with", or "connected to" another element (e.g., a second element), it means that the element may be coupled with the other element directly (e.g., wiredly), wirelessly, or via a third element.

As used in connection with various embodiments of the disclosure, the term "module" may include a unit implemented in hardware, software, or firmware, and may interchangeably be used with other terms, for example, logic, logic block, part, or circuitry. A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., the internal memory 136 or the external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., module or program) of the above-described components may include a singular or a plurality of entities, and some of the plurality of entities may be separately disposed in any other component. According to various embodiments, one or more components or operations among the above-described components may be omitted, or one or more other components or operations may be added. Alternatively or additionally, a plurality of components (e.g., module or program) may be integrated into one component. In this case, the integrated component may perform one or more functions of each component of the plurality of components identically or similarly to those performed by the corresponding component among the plurality of components prior to the integration. According to various embodiments, operations performed by a module, program, or other component may be executed sequentially, in parallel, repeatedly, or heuristically, or one or more of the operations may be executed in a different order or omitted, or one or more other operations may be added.

One or more embodiments of the invention are described with reference to the accompanying drawings, in which various embodiments are shown. One or more embodiments may, however, be embodied in many different forms, and should not be construed as limited to the embodiments set forth herein. Rather, these embodiments are provided so that this disclosure will be thorough and complete, and will fully convey the scope of embodiments of the invention to those skilled in the art.

It will be understood that when an element is referred to as being "on" another element, it can be directly on the other element or intervening elements may be present therebetween. In contrast, when an element is referred to as being "directly on" another element, there are no intervening elements present.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

What is claimed is:

1. An electronic device, comprising:
    a housing including a first surface, a second surface formed substantially parallel to the first surface, and a side surface enclosing a space formed between the first surface and the second surface;
    a printed circuit board disposed on the first surface of the housing;
    an antenna module spaced apart from the side surface of the housing by a predetermined distance and disposed on the first surface of the housing;
    a first cable configured to electrically connect the printed circuit board and the antenna module; and
    a heat dissipation unit disposed at one surface of the printed circuit board and having, at one surface thereof, a cable seating path in which at least a portion of the first cable is seated.

2. The electronic device of claim 1, further comprising a second cable electrically connectable to the printed circuit board,
    wherein the first cable and the second cable are spaced apart by at least a predetermined minimum distance.

3. The electronic device of claim 1, wherein the cable seating path is one of a plurality of cable seating paths at the one surface of the heat dissipation unit.

4. The electronic device of claim 3, wherein the plurality of cable seating paths are spaced apart from each other by a predetermined distance.

5. The electronic device of claim 1, wherein the cable seating path is one of a plurality of cable seating paths, and a plurality of first cables, including the first cable, are disposed in the cable seating path.

6. The electronic device of claim 1, wherein the cable seating path comprises a protrusion member capable of fixing the first cable.

7. The electronic device of claim 1, wherein the cable seating path comprises a straight area in which the first cable is disposed in a straight line and a bending area in which the first cable is bent and disposed.

8. The electronic device of claim 1, wherein the heat dissipation unit comprises a board exposure area exposing one surface of the printed circuit board.

9. The electronic device of claim 8, wherein the board exposure area has a length of a first distance in a first direction and a length of a second distance in a second direction.

10. The electronic device of claim 1, wherein the heat dissipation unit forms an upper end layer having a predetermined height at one surface thereof, and
    the cable seating path is formed at one side of the upper end layer.

11. An electronic device, comprising:
    a housing including a first surface, a second surface formed substantially parallel to the first surface, and a side surface enclosing a space formed between the first surface and the second surface;
    a printed circuit board disposed at the first surface of the housing;
    an antenna module spaced apart from the side surface of the housing and disposed at the first surface of the housing;
    a first cable configured to electrically connect the printed circuit board and the antenna module; and
    a heat dissipation unit disposed at one surface of the printed circuit board and having a protruding area protruded by a predetermined length at one side thereof,
    wherein the protruding area comprises a cable seating area in which at least a portion of the first cable is seated.

12. The electronic device of claim 11, further comprising a second cable electrically connectable to the printed circuit board,
    wherein the first cable and the second cable are spaced apart by at least a predetermined minimum distance.

13. The electronic device of claim 11, wherein the protruding area is a one of a plurality of protruding areas in the heat dissipation unit.

14. The electronic device of claim 13, wherein the plurality of protrusion areas are formed at intervals of a predetermined distance.

15. The electronic device of claim 11, wherein the first cable is one of a plurality of cables that are disposed in the cable seating area of the protruding area.

16. The electronic device of claim 15, wherein the plurality of first cables are disposed to be spaced apart from each other by a predetermined distance.

17. The electronic device of claim 11, wherein the protruding area has a predetermined height in a direction away from one surface of the heat dissipation unit.

18. The electronic device of claim 11, wherein the first cable comprises a cable straight area in which the first cable is formed in a straight line and a cable bending area in which the first cable is bent and formed.

19. The electronic device of claim 11, wherein the heat dissipation unit comprises a board exposure area exposing one surface of the printed circuit board in at least a portion thereof.

20. The electronic device of claim 11, further comprising:
- a shield member disposed between at least a portion of the printed circuit board and the heat dissipation unit; and
- a battery, wherein at least a portion of the battery is disposed on substantially coplanar with the printed circuit board.

* * * * *